United States Patent [19]

Myers et al.

[11] Patent Number: 5,400,950
[45] Date of Patent: Mar. 28, 1995

[54] METHOD FOR CONTROLLING SOLDER BUMP HEIGHT FOR FLIP CHIP INTEGRATED CIRCUIT DEVICES

[75] Inventors: Bruce A. Myers; Petrina L. Schnabel, both of Kokomo, Ind.

[73] Assignee: Delco Electronics Corporation, Kokomo, Ind.

[21] Appl. No.: 199,869

[22] Filed: Feb. 22, 1994

[51] Int. Cl.[6] ............................................. H05K 3/34
[52] U.S. Cl. .............................. 228/180.22; 228/248.1
[58] Field of Search ............... 228/180.22, 185, 248.1, 228/254

[56] References Cited

U.S. PATENT DOCUMENTS

| | | | |
|---|---|---|---|
| 4,764,804 | 8/1988 | Sahara et al. | 357/81 |
| 5,186,383 | 2/1993 | Melton et al. | 228/180.22 |
| 5,222,014 | 6/1993 | Lin | 361/414 |
| 5,281,772 | 1/1994 | Myers et al. | 174/267 |
| 5,323,084 | 1/1994 | Haitz | 313/500 |

Primary Examiner—Samuel M. Heinrich
Attorney, Agent, or Firm—Mark A. Navarre

[57] ABSTRACT

A method is provided for flip-chip bonding a flip chip to a substrate, which may be a ceramic substrate, printed wiring board, flexible circuit, or a silicon substrate, in which a number of input/output solder bumps are reflowed to both bond the flip chip to the circuit board as well as provide the necessary electrical connection between the flip chip and the circuit board's circuitry. The method enables the height of the input/output solder bumps to be closely controlled thereby providing sufficient spacing between the chip and its substrate, thus optimizing the cleanability and stress relief of the package. Generally, the preferred method involves the use of non-input/output, or "dummy" solder bumps which are present in sufficient numbers to overcome the tendency for the input/output solder bumps to draw the flip chip excessively close to the circuit board. Because the dummy solder bumps are electrically inactive, their height can be governed by electrically isolated pads on the surface of the circuit board. Consequently, definition of the input/output solder bumps and the dummy solder bumps does not require the use of solder stops or masks during formation or reflow of the solder bumps.

9 Claims, 1 Drawing Sheet

METHOD FOR CONTROLLING SOLDER BUMP HEIGHT FOR FLIP CHIP INTEGRATED CIRCUIT DEVICES

The present invention generally relates to methods by which a monolithic semiconductor device is mounted and bonded to a circuit board with input/output (I/O) solder bumps that electrically interconnect the device to the circuit board. More particularly, this invention relates to such a method in which a flip chip is reflow soldered to a circuit board, such that the height at which the flip chip device is supported over the circuit board is closely determined by numerous non-I/O solder bumps which generate a buoyant force that compensates for the force generated by the surface tension of I/O solder bumps during reflow soldering.

BACKGROUND OF THE INVENTION

A flip chip is generally a monolithic semiconductor device, such as an integrated circuit, having bead-like terminals formed on one surface of the chip. The terminals serve to both secure the chip to a circuit board and electrically connect the flip chip's circuitry to a conductor pattern formed on the circuit board, which may be a ceramic substrate, printed wiring board, flexible circuit, or a silicon substrate. Due to the numerous functions typically performed by the microcircuitry of a flip chip, a relatively large number of terminals are required. The size of a typical flip chip is generally on the order of a few millimeters per side, resulting in the terminals being crowded along the perimeter of the flip chip. As a result, flip chip conductor patterns are typically composed of numerous individual conductors, often spaced on the order of about 0.008 inch apart.

Because of the fine patterns of the terminals and conductor pattern, soldering a flip chip to its conductor pattern requires a significant degree of precision. Reflow solder techniques are widely utilized in the soldering of flip chips. Such techniques typically involve forming solder bumps on the surface of the flip chip using methods such as electrodeposition, by which a quantity of solder is accurately deposited on one surface of the flip chip. Heating the solder above its melting temperature serves to form the characteristic solder bumps. The chip is then soldered to the conductor pattern by registering the solder bumps with their respective conductors, and reheating, or reflowing, the solder so as to metallurgically and electrically bond the chip to the conductor pattern.

Deposition and reflow of the solder must be precisely controlled not only to coincide with the spacing of the terminals and the size of the conductors, but also to control the height of the solder bumps after soldering. As is well known in the art, controlling the height of solder bumps after reflow is necessary in order to prevent the surface tension of the molten solder bumps from drawing the flip chip excessively close to the substrate during the reflow operation. Sufficient spacing between the chip and its substrate is necessary for enabling stress relief during thermal cycles, allowing penetration of cleaning solutions for removing undesirable residues, and enabling the penetration of mechanical bonding and encapsulation materials between the chip and the substrate.

Solder bump height is typically controlled by limiting the size of the exposed conductor area to which the solder bump is allowed to reflow. This approach, represented in FIG. 1, conventionally involves the use of a solder stop 18, such as a solder mask or a printed dielectric mask, which covers or alters the conductor 14 in the bump reflow region in order to limit the area over which the solder bump 16 can reflow. Physics dictates that, within a certain range, a smaller reflow area results in a greater solder bump height after reflow for a given quantity of solder, though an excessively small reflow area tends to cause the solder bump to collapse, thereby significantly reducing the solder bump height. By properly limiting the degree to which the molten solder can laterally expand during reflow, the height of the solder bumps 16, and therefore the spacing between a chip 12 and a substrate 10, can be closely controlled by depositing an appropriate amount of solder at each terminal location. A variation of the above approach is illustrated in U.S. Pat. No. 4,764,804 to Sahara et al., in which an I/O solder bump is contained between and within a pair of recesses formed in the flip chip surface and the opposing surface of a substrate. A unique though related technique is disclosed in U.S. patent application Ser. No. (Attorney's Docket No. G-6211), assigned to the assignee of this invention, in which laser-formed solder stops are used to limit the flow of molten solder during reflow.

While the techniques for using masks are accepted and used in the art, certain shortcomings exist which are related to processing costs and accuracy. For example, printed and photoimaged dielectric masks do not provide adequate positional accuracy for certain flip chips, particularly flip chips with fine pitch solder bumps. The cost of obtaining the required accuracy may be prohibitive. In addition, although laser-formed solder stops, as taught by U.S. patent application Ser. No. (Attorney's Docket No. G-6211), may provide the necessary accuracy, it may be desirable to minimize processing time and costs.

Accordingly, it would be desirable if a process were available by which the height of a flip chip's solder bumps could be closely controlled without the conventional need for using printed or photoimaged solder masks, or laser-formed solder stops. A preferred process would be capable of a high degree of positional accuracy without adding processing steps, time or capital to the conventional processing of printed circuit board and ceramic substrates, as well as flex, silicon and various other substrates.

SUMMARY OF THE INVENTION

It is an object of this invention to provide a method by which a monolithic semiconductor device can be reliably secured and electrically interconnected to a conductor pattern formed on a circuit board.

It is a further object of this invention that such a method be a flip-chip bonding process, in which solder bumps formed on one surface of the device compliment the conductor pattern, and in which the solder bumps are bonded to the conductor pattern using a solder reflow technique.

It is another object of this invention that such a method enable the height of the solder bumps to be controlled, wherein the method does not require the use of printed or photoimaged solder masks or laser-formed solder stops to precisely define the solder reflow area on a conductor, but instead enables a high degree of positional accuracy without adding processing steps, time or capital to conventional processing methods for printed circuit board and ceramic substrates.

In accordance with a preferred embodiment of this invention, these and other objects and advantages are accomplished as follows.

According to the present invention, there is provided a method for controlling the height of input/output (I/O) solder bumps which electrically interconnect a flip chip to a circuit board. The method generally involves a solder reflow technique, by which I/O solder bumps formed on one surface of the flip chip are remelted, and thereby bonded to a conductor pattern on the circuit board. Contrary to the prior art, the method of this invention does not rely on the use of printed or photoimaged solder masks or laser-formed solder stops to limit the lateral expansion of the I/O solder bumps during reflow, but instead employs a number of non-input/output, or "dummy" solder bumps which coact to balance an opposing force generated by the surface tension of the I/O solder bumps during reflow. As a result, the height of the I/O solder bumps after reflow is substantially dictated by the height of the dummy solder bumps.

The method generally involves forming both I/O solder bumps and dummy bumps on a surface of the flip chip. The dummy bumps may be formed from the identical solder material as the I/O solder bumps. As is conventional, the I/O solder bumps are patterned on the flip chip to correspond to a conductor pattern formed on a circuit board. The conductor pattern is composed of numerous conductors which are electrically interconnected with an integrated circuit associated with the circuit board. In addition to the conductor pattern, a number of non-input/output pads are also formed on the circuit board. The non-input/output pads are positioned on the circuit board for mating with the dummy bumps. The flip chip is then mated with the circuit board such that the I/O solder bumps register with the conductors and such that the dummy bumps register with the non-input/output pads. The I/O solder bumps are then reflowed so as to solder the flip chip to the circuit board.

According to a preferred approach, during reflow, the height of each of the dummy bumps is determined by the size of its corresponding non-input/output pad. Specifically, the extent to which the dummy bumps will flow laterally during reflow is limited by the surface area of the non-input/output pads due to surface tension characteristics, such that the height of a dummy bump after reflow is determined by the size of its pad. The number of dummy bumps present on the flip chip is predetermined such that a buoyant force generated by the molten dummy bumps during reflow will counteract an opposing force generated by the surface tension of the molten I/O solder bumps during reflow. Consequently, the height of each of the I/O solder bumps after reflow is substantially dictated by the height of the dummy bumps, such that the tendency for the I/O solder bumps to draw the flip chip excessively close to the circuit board is overcome.

An alternate approach is to form the dummy bumps from the same alloy as the I/O bumps, but deposit a larger quantity of solder on the flip chip to form the dummy bumps. The flip chip is then mated directly to the circuit board surface, such that the circuit board surface may or may not be provided with non-input/output pads with which the dummy bumps are to register. Again, during reflow the dummy bumps will reflow and serve to "float" the flip chip, overcoming the surface tension of the I/O solder bumps.

Using the method of this invention, a flip chip can be reflow soldered to a circuit board without the use of printed or photoimaged solder masks or laser-formed solder stops for the purpose of limiting the lateral flow of its I/O solder bumps during reflow. Instead, the method relies on supporting the flip chip with a sufficient number of dummy bumps to overcome the natural tendency for the molten I/O solder bumps to draw the flip chip excessively close to the circuit board. Because the dummy bumps can be formed simultaneously with the I/O solder bumps, the method of this invention can be achieved without the requirement for additional processing steps or time, and without the requirement for specialized equipment. In particular, the previous requirement for precisely controlled masks and solder stops to ensure sufficient solder bump height after reflow has been completely eliminated.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings wherein.

DETAILED DESCRIPTION OF THE INVENTION

A method is provided for flip-chip bonding a flip chip to a circuit board, in which a number of input/output solder bumps are reflowed to both bond the flip chip to the circuit board as well as to provide the necessary electrical connection between the flip chip and the circuit board's circuitry. The method of this invention enables the height of the input/output solder bumps to be closely controlled so as to provide a sufficient gap between the flip chip and the circuit board for allowing flux residue cleaning, bump stress relief during thermal cycle, and the flow of mechanical bonding and encapsulation material between the flip chip and the circuit board, and generally involves the use of non-input/output, or "dummy" solder bumps which are present in sufficient numbers to overcome the tendency for the input/output solder bumps to draw the flip chip excessively close to the circuit board. Because the dummy solder bumps are electrically inactive, their height can be governed by electrically isolated pads on the surface of the circuit board. Consequently, definition of the input/output solder bumps and the dummy solder bumps does not require the use of solder stops or masks during formation or reflow of the solder bumps.

Figure 2:
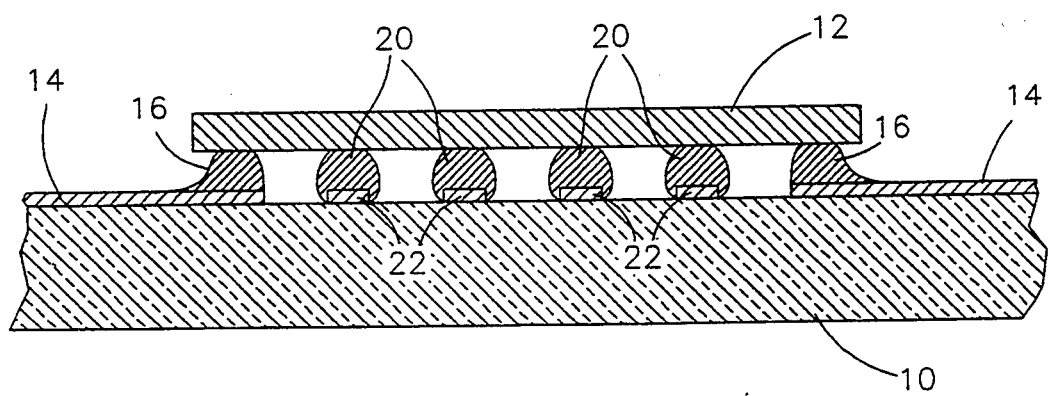
FIG. 2 is a cross-sectional view of a flip chip which has been reflow soldered to its corresponding conductor pattern in accordance with a first method of this invention.

The method of this invention will be described with reference to FIG. 2, which illustrates a flip chip 12 mounted to a circuit board, represented by a substrate 10. The substrate 10 can be either ceramic, printed circuit board, flexible circuitry or silicon, as is conventional with integrated circuit technologies. The flip chip 12 is a monolithic semiconductor device widely utilized in the industry, and is configured to be bonded to the substrate 10 using a flip-chip bonding process. Flip-chip bonding alleviates the use of a separate integrated circuit package with discrete leads. Instead, a number of bead-like projections are formed on one surface of the flip chip 12 to serve as terminals. These projections serve as terminals which electrically interconnect the flip chip 12 to a conductor pattern formed on the substrate 10. In practice, the projections are typically solder bumps 16 which have been screen printed or electrodeposited on the flip chip 12. The solder bumps 16 are accurately positioned on the flip chip 12 such that, when registered with a conductor pattern on the substrate 10, each of the solder bumps 16 will be accurately and uniquely mated with a corresponding conductor 14, as shown in FIG. 2. A metallurgical bond is achieved between the solder bumps 16 and the conductors 14 using a solder reflow technique, in which the solder bumps 16 are melted in order to form a corresponding number of solder joints between the flip chip 12 and the conductors 14.

Figure 1:
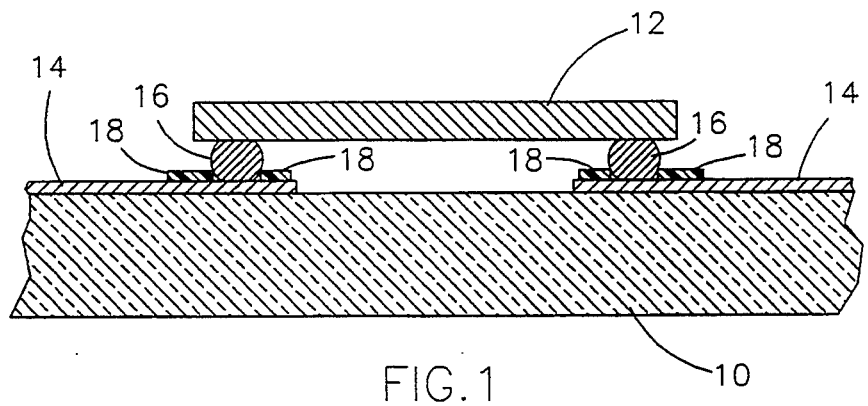
FIG. 1 is a cross-sectional view of a flip chip which has been reflow soldered to its corresponding conductor pattern in accordance with the prior art.

While the method of this invention is conventional to the extent described immediately above, the method differs significantly from conventional practices by the absence of solder stops and masks in the immediate area of the flip chip. Solder stops and masks, such as those illustrated with reference to the prior art in FIG. 1, are conventionally used to limit the ability of the solder bumps 16 to flow laterally over the conductors 14 during the reflow process, for the purpose of accurately controlling the final height of the solder bumps 16 after reflow. In contrast, according to the teachings of this invention, the height of the solder bumps 16 is determined by the effect of a number of electrically inactive, "dummy" solder bumps 20. As shown in FIG. 2, the dummy bumps 20 are each positioned on a pad 22 formed on the substrate 10. Because the dummy bumps 20 are electrically inactive, the pads 22 can be relatively small and electrically isolated from the conductors 14, as well as from each other.

In its simplest form, the method of this invention involves forming the dummy bumps 20 from the same solder material as the solder bumps 16. Consequently, the dummy bumps 20 can be formed simultaneously with the solder bumps 16 using known deposition techniques, such as screen printing or electrodeposition methods. Furthermore, the pads 22 can also be formed from the same material as the conductors 14, permitting the pads 22 to be formed simultaneously with the conductors 14 which are required for the solder bumps 16. As such, the present invention does not require any additional processing steps, time or equipment, apart from that conventionally required for flip-chip bonding processes.

The preferred method for bonding the flip chip 12 to the substrate 10 involves depositing the solder bumps 16 on a surface of the flip chip 12 using any one of a number of conventional techniques, such as electrodeposition or screen printing of solder paste followed by reflow. Suitable solder alloys include tin-lead alloys containing about 10 to about 60 percent tin, indium-lead alloys containing about 10 to about 60 percent indium, and indium-lead-silver alloys containing about 10 to about 60 percent indium and up to about 5 percent silver. Solder is simultaneously deposited at additional locations on the same surface of the flip chip 12. The solder deposited at this second group of locations will form the dummy bumps 20.

The flip chip 12 is then soldered to the substrate 10 using a reflow technique which heats the solder bumps 16 and dummy bumps 20 to a temperature above the melting point of the solder alloy. Reflow can be achieved by any of a number of techniques well known in the art, and therefore will not be discussed in detail here. The solder bumps 16 and the dummy bumps 20 on the flip chip 12 are first registered with the conductors 14 and the pads 22, respectively, on the substrate 10. As noted above, the pads 22 and conductors 14 can be simultaneously formed from the same material, such as a suitable copper, tin/lead alloy or thick film conventionally used in the art. Reflow preferably occurs at a temperature of about 45° C. above the liquidus temperature of the solder alloy, and for a duration of about 40 seconds, which is sufficient to suitably melt the alloy and allow adequate flow of the alloy.

During reflow, while the solder bumps 16 and the dummy bumps 20 are molten, the surface tension of the molten solder bumps 16 will generate a force which tends to draw the flip chip 12 towards the substrate 10. Because solder stops or masks are not present, the unrestrained lateral flow of the molten solder bumps 16 attempts to draw the flip chip 12 excessively close to the substrate 10. To combat this influence, a buoyant force is generated by the molten dummy bumps 20 which oppose the tensional force generated by the molten solder bumps 16. This buoyant force results from the lateral flow of each of the molten dummy bumps 20 being limited by the surface area of its corresponding pad 22. The surface tension of the molten dummy bump 20 will prevent the solder from flowing off the pads 22, thus forcing the dummy bumps 20 to assume a height which is dictated by the amount of solder initially deposited on the flip chip 12. Consequently, the height of each dummy bump 20 after reflow is determined primarily by the amount of solder alloy used to define the dummy bump 20 and the size of its pad 22, each of which can be readily and accurately controlled with equipment presently used for solder deposition, circuit board and thick film processes.

In that the opposing tensional force generated by the solder bumps 16 counteracts the desired behavior for the molten dummy bumps 20, a sufficient number of dummy bumps 20 must be present to suitably overcome this tensional force in order to acquire the desired overall solder bump height for the flip chip bond. In effect, the molten dummy bumps 20 must serve to float the flip chip 12 a suitable distance above the surface of the substrate 10. During reflow, the flip chip 12 will move to the bump height where the sum of all forces on the flip chip 12 equals zero. That is, a final position is established where the weight of the flip chip 12 plus the tensional forces exerted by the wetting action of the solder bumps 16 is equal to the buoyant force generated by the dummy bumps 20. The bumps 16 and 20 are sized to ensure proper wetting to the conductors 14 and pads 22, respectively. As those skilled in the art will appreciate, an appropriate balance between the dummy bumps 20 required for a flip chip 12 having a specified number of solder bumps 16 can be achieved with minimal experimentation.

FIG. 2 represents the final form of the flip chip 12 after the solder bumps 16 and the dummy bumps 20 have been allowed to resolidify. For a flip chip 12 measuring roughly 5 millimeters on a side and having about 38 solder bumps 16 and about 67 dummy bumps 20, the resulting solder bumps 16 and dummy bumps 20 have been found to have a height of about 0.08 millimeter, providing an acceptable spacing between the flip chip 12 and the substrate 10. It is noted, that although the dummy bumps 20 are shown as located at the interior of the flip chip 12, some or all of the dummy bumps 20 could be also located at the perimeter of the flip chip 12. Likewise, I/O bumps 16 could also be located at the interior of the flip chip 12.

A variation of this above approach eliminates the pads 22, and instead places the dummy bumps 20 directly on the surface of the substrate 10. A greater quantity of solder must be used to form each dummy bump 20 in order to compensate for the absence of the pads 22. As before, a sufficient number of dummy bumps 20 must be present to overcome the tensional force generated by the solder bumps 16 in order to achieve the desired overall solder bump height for the flip chip bond.

From the above, it can be seen that a significant advantage of this invention is that a flip chip 12 can be reflow soldered to a circuit board without requiring the use of printed or photoimaged solder masks or laser-formed solder stops for the purpose of limiting the lateral flow of its I/O solder bumps 16 during reflow. Instead, the method of this invention enables the flip chip to be supported with a number of dummy bumps 20, which serve to overcome the tendency for the molten solder bumps 16 to draw the flip chip 12 excessively close to the circuit board. The dummy bumps 20 can be formed using the same processing and equipment required to form the solder bumps 16, avoiding the necessity for specialized processing equipment. In a preferred embodiment, the dummy bumps 20 can be formed simultaneously with the solder bumps 16 from the same material, such that the method of this invention can be practiced without the requirement for additional processing steps or time.

In addition, the method of this invention enables the height of the solder bumps 16 to be closely controlled in order to achieve proper spacing between the flip chip 12 and the circuit board. In so doing, a sufficient gap between the flip chip 12 and the substrate 10 is achieved to enable flux residue cleaning, stress relief of the solder bumps 16 during thermal cycle, and flow of a mechanical bonding and encapsulation material between the flip chip 12 and the substrate 10.

While our invention has been described in terms of a preferred embodiment, it is apparent that other forms could be adopted by one skilled in the art—for example, by modifying the processing parameters such as the temperatures or durations employed, or by substituting appropriate materials. Accordingly, the scope of our invention is to be limited only by the following claims.

The embodiments of the invention in which an exclusive property or privilege is claimed are defined as follows:

1. A method for controlling the height of input/output solder bumps which electrically interconnect a monolithic semiconductor device to a substrate, the method comprising the steps of:
    forming non-input/output bumps and said input/output solder bumps on a surface of said monolithic semiconductor device;
    forming conductors on said substrate;
    mating said monolithic semiconductor device with said substrate such that said input/output solder bumps register with said conductors; and
    reflow soldering said monolithic semiconductor device to said substrate such that the height of each of said input/output solder bumps after reflow is dictated by the height of said non-input/output bumps, a sufficient number of said non-input/output bumps being present such that a buoyant force generated by said non-input/output bumps balances an opposing tensional force generated by the surface tension of said input/output solder bumps during said reflow soldering step.

2. A method as recited in claim 1 further comprising the step of forming non-input/output pads on said substrate for registering with said non-input/output bumps, wherein said non-input/output bumps become molten during said reflow step such that the height of each of said non-input/output bumps after reflow is determined by the composition and size of a corresponding one of said non-input/output pads.

3. A method as recited in claim 2 wherein said non-input/output pads are formed on said substrate so as to be physically isolated from each other and from said conductors.

4. A method as recited in claim 1 wherein said non-input/output bumps and said input/output solder bumps are formed simultaneously from a single solder material.

5. A method for controlling the height of input/output solder bumps which electrically interconnect a flip chip device to a substrate, the method comprising the steps of:
    forming non-input/output solder bumps and said input/output solder bumps on a surface of said flip chip device, said input/output solder bumps defining terminal locations on said flip chip device;
    forming a flip chip conductor pattern on said substrate which is complementary to said terminal locations on said flip chip device, said flip chip conductor pattern comprising a plurality of conductor pads on said substrate;
    forming non-input/output pads on said substrate for mating with said non-input/output solder bumps;
    mating said flip chip device with said substrate such that said terminal locations register with said flip chip conductor pattern so as to electrically interconnect said input/output solder bumps to said plurality of conductor pads, and such that said non-input/output solder bumps register with said non-input/output pads; and
    reflow soldering said flip chip device to said substrate such that the height of each of said non-input/output solder bumps is determined by the composition and size of a corresponding one of said non-input/output pads, a sufficient number of said non-input/output solder bumps being present such that a buoyant force generated by said non-input/output solder bumps balances an opposing tensional force generated by the surface tension of said input/output solder bumps during said reflow soldering step; whereby the height of each of said input/output solder bumps is substantially dictated by the height of said non-input/output solder bumps.

6. A method as recited in claim 5 wherein said non-input/output solder bumps and said input/output solder bumps are formed simultaneously from a single solder material.

7. A method as recited in claim 5 wherein said conductor pads and said non-input/output pads are formed simultaneously from the same material.

8. A method as recited in claim 5 wherein said step of forming said non-input/output solder bumps and said input/output solder bumps comprises depositing a solder paste on said surface of said flip chip device.

9. A method as recited in claim 5 wherein said non-input/output pads are formed on said substrate so as to be physically isolated from each other and from said conductors pads.

* * * * *